(12) United States Patent
Van Dyke et al.

(10) Patent No.: US 10,394,292 B1
(45) Date of Patent: Aug. 27, 2019

(54) CRYOGENIC COMPUTING SYSTEM WITH THERMAL MANAGEMENT USING A METAL PREFORM

(71) Applicant: Microsoft Technology Licensing, LLC, Redmond, WA (US)

(72) Inventors: Jonathan F. Van Dyke, Baltimore, MD (US); Martin B. Christiansen, Laurel, MD (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/005,117

(22) Filed: Jun. 11, 2018

(51) Int. Cl.
*H05K 7/20* (2006.01)
*G06F 1/20* (2006.01)
*H01L 39/22* (2006.01)

(52) U.S. Cl.
CPC .............. *G06F 1/20* (2013.01); *H01L 39/223* (2013.01); *H05K 7/20509* (2013.01)

(58) Field of Classification Search
None
See application file for complete search history.

(56) References Cited

U.S. PATENT DOCUMENTS

| | | | |
|---|---|---|---|
| 6,653,741 B2 | 11/2003 | Sreeram et al. | |
| 7,535,714 B1 | 5/2009 | Sinha | |
| 7,806,994 B2 | 10/2010 | Smith et al. | |
| 8,460,533 B2 | 6/2013 | Szocs et al. | |
| 8,809,679 B1 | 8/2014 | Crook et al. | |
| 9,263,662 B2 | 2/2016 | Boukai et al. | |
| 9,282,675 B2 * | 3/2016 | Campbell | H05K 7/20 |
| 9,646,910 B2 * | 5/2017 | Ahuja | G06F 1/20 |
| 9,668,334 B2 * | 5/2017 | Refai-Ahmed | H05K 1/0203 |
| 10,159,161 B2 * | 12/2018 | Christiansen | H05K 7/1425 |
| 10,165,667 B1 * | 12/2018 | Christiansen | H05K 1/0201 |
| 2006/0045962 A1 * | 3/2006 | Miura | C23C 26/02 |
| | | | 427/96.1 |
| 2008/0156475 A1 | 7/2008 | Suh | |
| 2014/0357492 A1 * | 12/2014 | Daibo | H01F 6/04 |
| | | | 505/163 |
| 2018/0168070 A1 * | 6/2018 | Ware | H01L 23/3677 |

FOREIGN PATENT DOCUMENTS

| | | |
|---|---|---|
| CN | 102866749 A | 1/2013 |
| CN | 104701587 A | 6/2015 |

* cited by examiner

*Primary Examiner* — Courtney L Smith
(74) *Attorney, Agent, or Firm* — Ranjeev Singh; Singh Law, PLLC

(57) ABSTRACT

Computing systems including heat sinks (e.g., a first and a second heatsink) and metal preforms (e.g., a first and a second metal preform) are provided. The first metal preform is bonded to a portion of the first heat sink, where the first metal preform is configured to conform to the at least a portion of a superconducting component when the superconducting component is pressed against the first metal preform and hold shape even after a first pressure on the first metal preform is relieved. The computing system includes a second metal preform bonded to a portion of the second heat sink, where the second metal preform is configured to conform to the at least the portion of a superconducting component when the superconducting component is pressed against the second metal preform and hold shape even after a second pressure on the second metal preform is relieved.

20 Claims, 7 Drawing Sheets

CRYOGENIC COMPUTING SYSTEM WITH THERMAL MANAGEMENT USING A METAL PREFORM

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems. As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors.

An additional approach to the use of processors and related components, based on CMOS technology, is the use of superconducting logic-based components and devices. Superconducting logic-based components and devices can also be used to process quantum information, such as qubits. However, such devices need to operate at cryogenic temperatures (e.g., 4 K) and thus requiring cooling.

SUMMARY

In one aspect, the present disclosure relates to a computing system including a first substrate having a first surface with a first plurality of superconducting components attached to the first surface and a second substrate having a second surface with a second plurality of superconducting components attached to the second surface. The computing system may further include a first heat sink having a first surface and a first plurality of recesses formed in the first surface such that each of the first plurality of recesses is configured to provide a space to accommodate at least a portion of a first superconducting component from among the first plurality of superconducting components. The computing system may further include a second heat sink having a second surface and a second plurality of recesses formed in the second surface such that each of the second plurality of recesses is configured to provide a space to accommodate at least a portion of a second superconducting component from among the second plurality of superconducting components.

The computing system may further include a first metal preform bonded to at least a first portion of the first heat sink, where the first metal preform is configured to conform to the at least the portion of the first superconducting component when the first superconducting component is pressed against the first metal preform and hold shape even after a first pressure on the first metal preform is relieved. The computing system may further include a second metal preform bonded to at least a second portion of the second heat sink, where the second metal preform is configured to conform to the at least the portion of the first superconducting component when the second superconducting component is pressed against the second metal preform and hold shape even after a second pressure on the second metal preform is relieved.

In another aspect the present disclosure relates to a computing system including a first substrate having a first surface with a first plurality of superconducting components attached to the first surface and a second substrate having a second surface with a second plurality of superconducting components attached to the second surface. The computing system may further include a first heat sink having a first surface and a first plurality of recesses formed in the first surface such that each of the first plurality of recesses is configured to provide a space to accommodate at least a portion of a first superconducting component from among the first plurality of superconducting components. The computing system may further include a second heat sink having a second surface and a second plurality of recesses formed in the second surface such that each of the second plurality of recesses is configured to provide a space to accommodate at least a portion of a second superconducting component from among the second plurality of superconducting components.

The computing system may further include a first indium preform cold-bonded to at least a first portion of the first heat sink, where the first indium preform is configured to conform to the at least the portion of the first superconducting component when the first superconducting component is pressed against the first indium preform and hold shape even after a first pressure on the first indium preform is relieved. The computing system may further include a second indium preform cold-bonded to at least a second portion of the second heat sink, where the second indium preform is configured to conform to the at least the portion of the first superconducting component when the second superconducting component is pressed against the second indium preform and hold shape even after a second pressure on the second indium preform is relieved.

In yet another aspect, the present disclosure relates to a method for manufacturing a computing system comprising a first substrate having a first surface with first plurality of superconducting components attached to the first surface, a second substrate having a second surface with a second plurality of superconducting components attached to the second surface. The method may include forming a first heat sink having a first surface and a first plurality of recesses formed in the first surface such that each of the first plurality of recesses is configured to provide a space to accommodate at least a portion of a first superconducting component from among the first plurality of superconducting components. The method may further include forming a second heat sink having a second surface and a second plurality of recesses formed in the second surface such that each of the second plurality of recesses is configured to provide a space to accommodate at least a portion of a second superconducting component from among the second plurality of superconducting components.

The method may further include bonding a first metal preform bonded to at least a first portion of the first heat sink, where the first metal preform is configured to conform to the at least the portion of the first superconducting component when the first superconducting component is pressed against the first metal preform and hold shape even after a first pressure on the first metal preform is relieved. The method may further include bonding a second metal preform bonded to at least a second portion of the second heat sink, where the second metal preform is configured to conform to the at least the portion of the first superconducting component when the second superconducting component is pressed against the second metal preform and hold shape even after a second pressure on the second metal preform is relieved.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
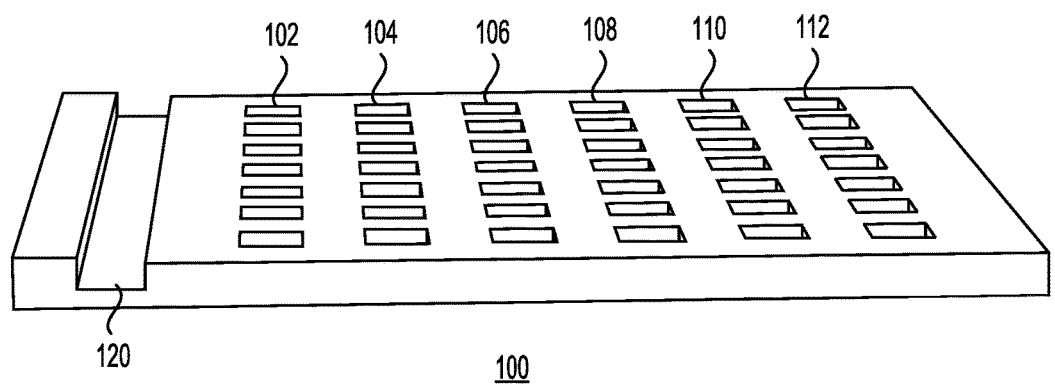
FIG. 1 shows a diagram of a heat sink configured to reduce heat radiation from superconducting components in accordance with one example.

Examples described in this disclosure relate to computing systems that include superconducting components and devices. Certain examples of the present disclosure relate to a computing system comprising components operating at cryogenic temperatures (e.g., at or below 4 Kelvin). In one example, the computing system is housed in a vacuum assembly. In this example, the superconducting system may include one or more superconducting component formed on a substrate. The superconducting component may include integrated circuit chips mounted on the substrate. The packaging of such superconducting components is challenging because such components may need to withstand large changes in the ambient temperature (e.g., from about 300 Kelvin to about 4 Kelvin or lower). Certain examples of the present disclosure describe examples of computing systems that include heat sink and metal preform arrangements that allow the superconducting components to withstand coefficient of thermal expansion (CTE) mismatch over such large changes in temperature.

Superconducting components and devices may use Josephson junctions to implement the functionality associated with a circuit. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the superconducting circuits. As an example, superconductors are materials that can carry a direct electrical current (DC) in the absence of an electric field. Superconductors have a critical temperature (Tc) below which they have zero resistance. Niobium, one such superconductor, has a critical temperature (Tc) of 9.3 Kelvin. At temperatures below Tc, niobium is superconductive; however, at temperatures above Tc, it behaves as a normal metal with electrical resistance. Thus, in the SIS type of Josephson junction superconductors may be niobium superconductors and insulators may be $Al_2O_3$ barriers. In SIS type of junctions, the superconducting electrons are described by a quantum mechanical wavefunction. A changing phase difference in time of the phase of the superconducting electron wave-function between the two superconductors corresponds to a potential difference between the two superconductors.

Various superconducting circuits including transmission lines can be formed by coupling multiple Josephson junctions by inductors or other components, as needed. Microwave pulses can travel via these transmission lines under the control of at least one clock. The microwave pulses can be positive or negative or a combination thereof. The microwave pulses may have a frequency of up to 10 GHz or higher. Any circuit board or other type of structure, such as an interposer with such superconducting circuits may be required to support not only the high-frequency microwave signals but also direct current (DC) signals.

Although there are several benefits of superconductivity, including lower resistance and better bandwidth characteristics, superconducting materials need to be operated at cryogenic temperatures (e.g., 4K). [ADD MORE] In addition, the use of additional features that improve the thermal conduction may further enhance the operational efficiency of such a system.

FIG. 1 shows a heat sink 100 that may be configured to reduce heat radiation from superconducting components. Heat sink 100 may be made using copper or another appropriate heat conducting metal or alloy. As shown in FIG. 1, heat sink 100 may include recesses or windows 102, 104, 106, 108, 110, and 112 formed to receive deformed portions of a metal perform (e.g., an indium preform), where the deformation may occur as a result of the pressure applied to the metal preform by the components mounted on a substrate. Heat sink 100 may further include a recessed portion 120 configured to receive a wedge-lock or another type of locking system.

Figure 2:
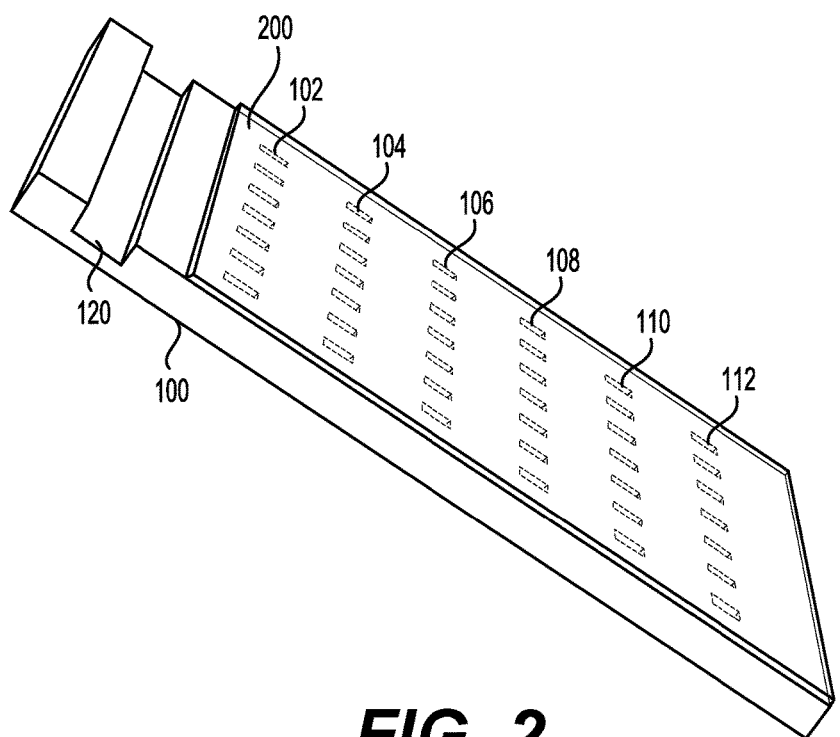
FIG. 2 shows a diagram of a metal preform (e.g., an indium preform) pressed against the heat sink of FIG. 1 in accordance with one example.

FIG. 2 shows a metal preform 200 (e.g., an indium preform) pressed against heat sink 100 of FIG. 1. Prior to pressing metal preform 200 against heat sink 100, the surfaces of the metal preform 200 may be deoxidized. The amount of pressure may be selected to ensure the formation of cold bonds between metal preform 200 and heat sink 100. The cold bonds may be formed as a result of cold welding. In addition, this step may be performed at elevated temperatures up to 145 degrees Celsius and high clamping forces. During formation of a computing system including superconducting components, this step may be performed to ensure cold bonding between metal preform 200 and heat sink 100. The cold bonding may ensure that metal preform 200 is adhered to heat sink 100 not only physically, but also thermally. This way, metal preform 200 may provide a thermal path for dissipating any heat from superconducting components and may also help with mitigating the coefficient of thermal expansion (CTE) mismatch over large changes in temperature that occur during the cool down from about 300 Kelvin to 4 Kelvin. Although an indium metal preform is described, metal preform 200 may be formed using copper. As an example, metal preform 200 may comprise a high residual-resistance ratio (RRR) copper foil.

Figure 3:
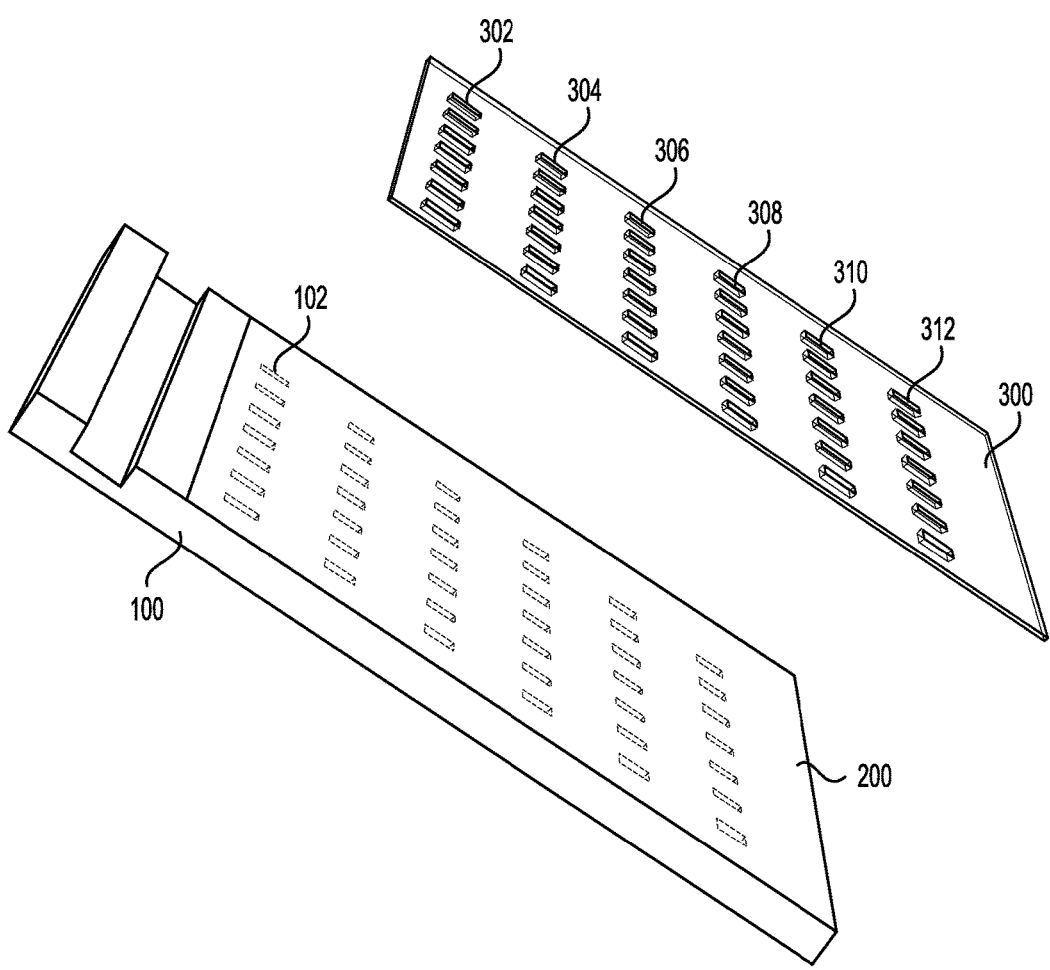
FIG. 3 shows a diagram of a substrate having superconducting components mounted on it in accordance with one example.

FIG. 3 shows a substrate 300 having superconducting components 302, 304, 306, 308, 310, and 312 mounted on it. Substrate 300 may be formed using glass, silicon, or other suitable materials; for example, various types of polymers. Other types of substrate materials may also be used, including Rogers materials and Megtron6. In addition, substrate 300 may include other layers, including dielectric layers, such as liquid crystal polymers (LCPs). In one example, the glass material may be borosilicate glass. In one example, substrate 300 may be a one-piece glass substrate. In one example, superconducting components (e.g., Central-Processing Units (CPUs), Graphics-Processing Units (GPUs), Artificial Intelligence Processors, Field-Programmable Gate Arrays (FPGAs), Application-Specific Integrated Circuits (ASICs), Application-Specific Standard Products (ASSPs), System-on-a-Chip systems (SOCs), or Complex Programmable Logic Devices (CPLDs), or other types of processing components) and memory components, including both volatile memories and non-volatile memories (e.g., Josephson magnetic random access memories (JMRAMs), magnetic tunnel junction (MTJ)-based random access memories, or other types of superconducting memories)) may be mounted on substrate 300. In one example, the superconducting components may be attached to substrate 300 using any of the various techniques, including flip-chip bonding.

Each of the superconducting component may include a stack of superconducting layers and dielectric layers formed on a substrate. In one example, the superconducting component may be formed to support signals ranging from DC to signals having a frequency that is greater than 10 GHz. In this example, the superconducting component may be fabricated over large silicon substrates such as 200 mm wafers, 300 mm wafers or even larger wafers, which may be separated into multiple dies. In one example, the substrate could be made from silicon or any other thermally insulating or conducting material. Also, in this example, signal traces and ground planes may be formed by sputtering niobium, or a similar superconducting material. As an example, compounds of niobium such as niobium nitride (NbN) or niobium titanium nitride (NbTiN) may also be used. Other physical vapor deposition (PVD) methods, such as molecular beam epitaxy (MBE) may also be used. Depending on the type of the material used for the traces, sputtering processes, chemical vapor deposition (CVD) processes, plasma enhanced chemical vapor deposition (PECVD) process, evaporation processes, or atomic layer deposition (ALD) processes may also be used. Thus, for example, the niobium compounds such as NbN and NbTiN may be formed using a CVD process.

In one example, in the superconducting components, the dielectric layers could be spin-on polyimide, Benzocyclobutene (BCB), liquid crystal polymer (LCP), or some other polymer material. The superconducting components may further include vias that may be formed by conformal deposition of the niobium in the same deposition step as the traces or ground plane. The via wells could be patterned directly in a photo-imageable polyimide, or etched in a separate step. The metal traces and vias may be defined in the same subtractive etch step. The pad connections may be configured to support Ti/Au or Ti/Al pads for a variety of wire bond or flip chip bump and wire bond technologies, such as Indium solder bump, Tin-Silver (Snag) solder bump, Gold stud bump, Copper pillar bump, or other electrical interconnect bump types.

Superconducting components may include a dielectric layer formed over a substrate. The dielectric layer may be formed by depositing a dielectric (e.g., liquid crystal polymer (LCP)) on the chip substrate. A superconducting layer may be formed over the dielectric layer. The superconducting layer may be formed using any of the deposition techniques, such as CVD or PECVD, and then patterning the deposited material using photolithography. The layout for the superconducting structures may be created using a place and route design tool that is used to create the layout for the superconducting wires or other elements. As an example, photo-resist may be patterned to protect only those areas of the superconducting layer that will be formed as superconducting wires or other structures as defined by the layout of the particular layer, such as a metal layer. Other superconducting metals or metal alloys may also be used as part of this step. In one example, the vias and the traces may be formed by conformal deposition of niobium in the same deposition step as the one used for forming the traces. Niobium may be deposited by sputtering or other similar processes. Other physical vapor deposition (PVD) methods, such as molecular beam epitaxy (MBE), may also be used.

Certain superconducting layers may be configured to distribute clock signals through the superconducting component while other superconducting layers may be configured to distribute other signals. Indeed, the functionality of the various superconducting layers could be modified based on the requirements associated with the superconducting component.

Still referring to FIG. 3, substrate 300 may need to be maintained at a temperature that is suitable for allowing the superconducting devices to operate consistent with the superconductivity principles. Thus, superconducting components may be maintained at cryogenic temperatures (e.g., 2K to 77K). This may be accomplished via the combination of thermal isolation and cooling via liquid helium or other such coolants. In one example, a system operating in a cryogenic environment may require a vacuum to operate properly. In one example, a vacuum may relate to a pressure in a range of $10^{-3}$ Torr to $10^{-10}$ Torr. The use of the vacuum ensures that there is no convection and thereby advantageously allowing components that are operating at very different temperatures to be attached to the same substrate. It is to be recognized that the temperature ranges referred to herein relate to the temperature of the environment in which these components are operating and not the temperature of the components themselves. Thus, references such as the components are "operating at" or "maintained at" refer to the temperature of the environment in which these components are operating or are being maintained inside.

With continued reference to FIG. 3, superconducting components 302, 304, 306, 308, 310, and 312 may communicate with each other using circuit traces formed on the top or the bottom surface of substrate 300. The circuit traces may be formed using a suitable manufacturing process, including, but not limited to, selective laser sintering, fused deposition modeling, direct metal laser sintering, stereolithography, cladding, electron beam melting, electron beam direct manufacturing, aerosol jetting, ink jetting, semi-solid freeform fabrication, digital light processing, 2 photon polymerization, laminated object manufacturing, 3D printing, or other similar manufacturing processes. In one example, the circuit traces may be made of niobium (or another suitable superconducting material). This region may exclude any normal metal, e.g., copper metal. Although FIG. 3 shows a certain arrangement of superconducting components 302, 304, 306, 308, 310, and 312, these could be arranged in a different manner. In addition, fewer or additional components, substrates, and other components may be present.

Figure 4:
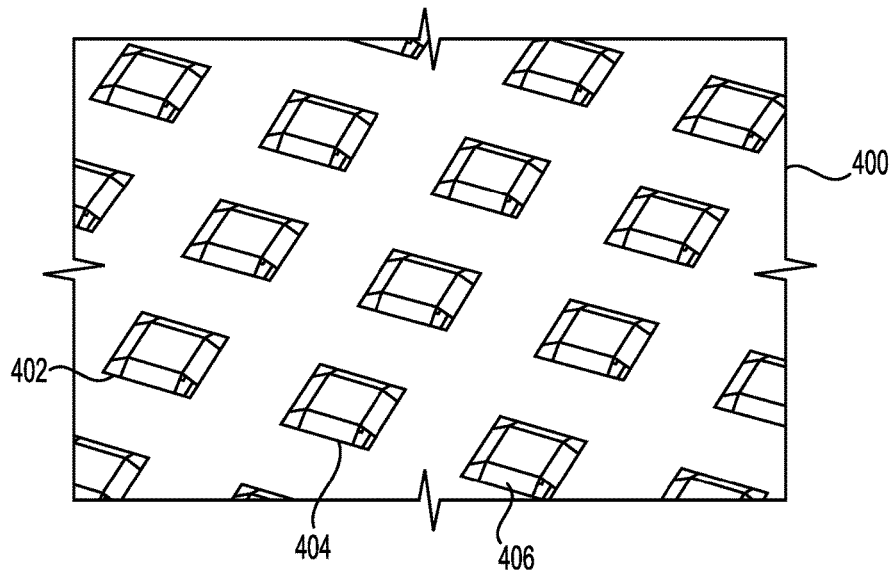
FIG. 4 shows a diagram of a deformed metal preform in accordance with one example.

With continued reference to FIG. 3, substrate 300 may be pressed against metal preform 200. The result of the pressure may be such that the metal preform 200 may be deformed as shown in FIG. 4. Thus, deformed portions, including deformed portions 402, 404, and 406, may be formed.

Figure 5:
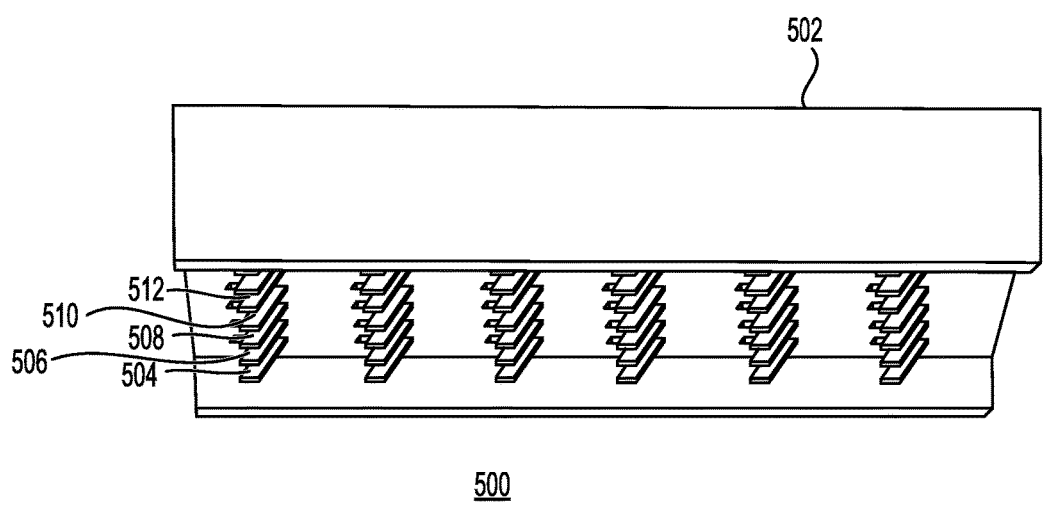
FIG. 5 shows a diagram of a spring board that may be used to compress a metal preform against the top surfaces of the superconducting components mounted on a substrate.

FIG. 5 shows a spring board 500 that may be used to compress metal preform 200 against top surfaces of the superconducting components mounted on substrate 300. Spring board 500 may be formed of beryllium, copper, phosphor bronze, bronze, brass, or other suitable materials. Spring board 500 may include spring-loaded structures, including spring-loaded structures 504, 506, 508, 510, and 512, that may provide a flexible compressive force and yet allow at least certain amount of expansion and contraction caused by thermal variations.

Figure 6:
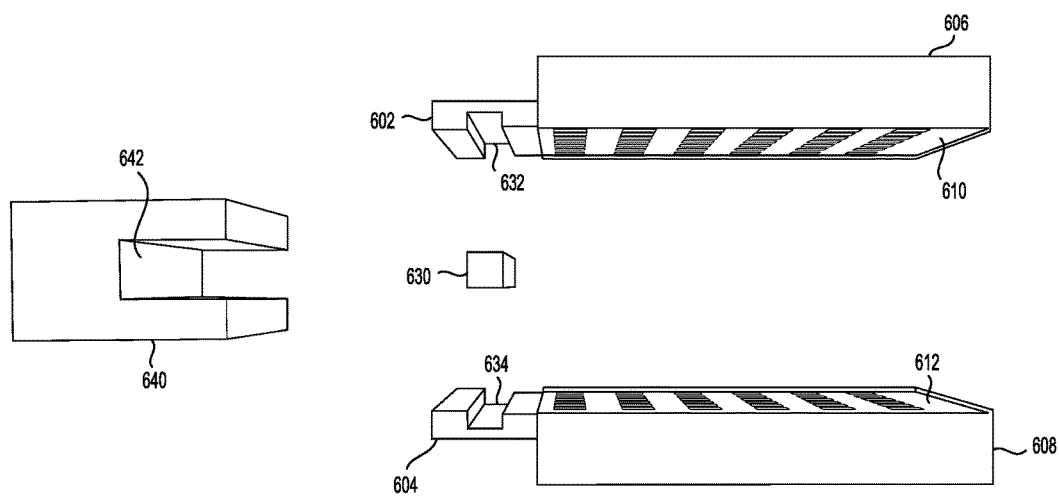
FIG. 6 shows components of an example two-sided assembly that may be used as part of a computing system.

FIG. 6 shows components of an example two-sided assembly 600 including a symmetric arrangement of heat sinks 602 and 604, metal preforms (not visible in this drawings because they are sandwiched between the respective substrate and the heat sink), substrates 610 and 612, and spring boards 606 and 608 that may be installed in a vacuum environment. Two-sided assembly 600 may be used as part of a computing system. Thus, a computing system may include one or more two-sided assemblies described in the present disclosure. Substrate 610 may include superconducting components (whose backside is visible in FIG. 6). Substrate 612 may include superconducting components (whose backside is visible in FIG. 6). Two-sided assembly 600 may be coupled to a cold rail 640 (e.g., a 4.2 K rail) via a wedge-lock 630. Cold rail 640 may include a recessed portion 642 to receive wedge-lock 630. Heat sink 602 may include a recessed portion 632 to receive wedge-lock 630 and similarly heat sink 604 may include a recessed portion 634 to receive wedge-lock 630. Although FIG. 6 shows a certain number of components arranged in a certain manner, additional or fewer components may be incorporated as part of two-sided assembly 600 and they may be arranged differently.

Figure 7:
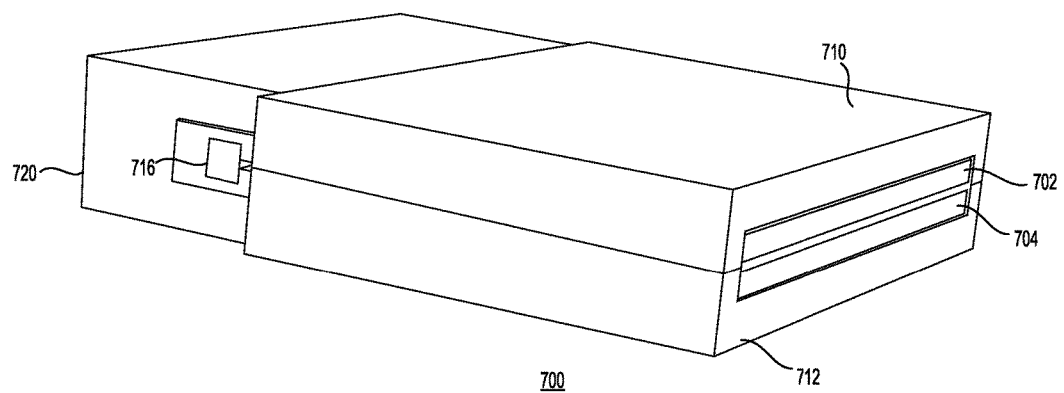
FIG. 7 shows components of an example two-sided assembly that may be used as part of a computing system.

FIG. 7 shows an example two-sided assembly 700 including a symmetric arrangement of heat sinks 702 and 704, metal preforms (not visible in this drawings because they are sandwiched between the respective substrate and the heat sink), substrates (not visible), and spring boards 710 and 712 that may be installed in a vacuum environment. Two-sided assembly 700 is be coupled to a cold rail 720 (e.g., a 4.2 K rail) via a wedge-lock 716. Clamping each of heat sinks 702 and 704 to cold rail 720 may result in a transfer of thermal energy from the superconducting components mounted on the substrates to cold rail 720. Although FIG. 7 shows a certain number of components arranged in a certain manner, additional or fewer components may be incorporated as part of two-sided assembly 700 and they may be arranged differently.

Figure 8:
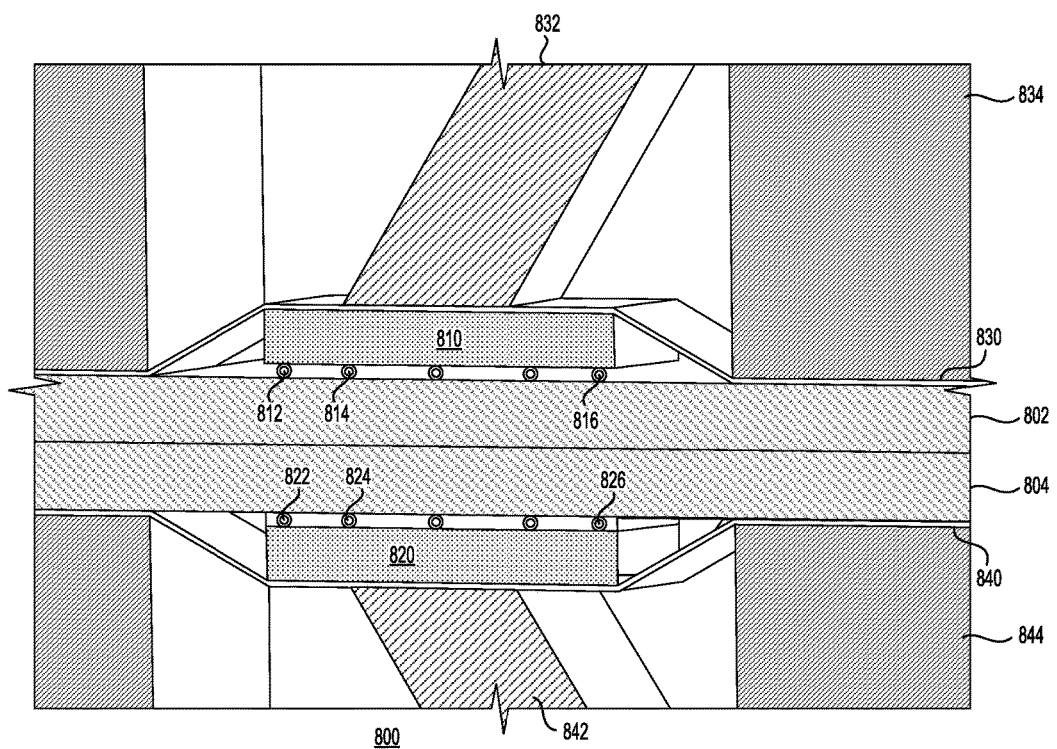
FIG. 8 a magnified cross-section view of a two-sided assembly in accordance with one example.

FIG. 8 shows a magnified cross-section view of a two-sided assembly (e.g., two-sided assembly 700) in accordance with one example. Superconducting component 810 is shown as attached to substrate 802 via indium bumps 812, 814, and 816. Similarly, superconducting component 820 is shown as attached to substrate 804 via indium bumps 822, 824, and 826. In addition, metal preform (e.g., an indium preform) 830 is shown as being in direct contact with a top surface of superconducting component 810. Spring loaded force is applied to a top surface of metal preform 830 to create a stronger, yet flexible contact between a bottom surface of metal preform 830 and a top surface of superconducting component 810. The top surface of superconducting component 810 may be coated with indium to create a bond between metal preform 830 and the top surface of superconducting component 810. In addition, metal preform (e.g., an indium preform) 840 is shown as being in direct contact with a top surface of superconducting component 820. Spring loaded force is applied to a top surface of metal preform 840 to create a stronger, yet flexible contact between a bottom surface of metal preform 840 and a top surface of superconducting component 820. The top surface of superconducting component 820 may be coated with indium to create a bond between metal preform 840 and the top surface of superconducting component 820. Heat sinks 834 and 844 are also shown as being in direct contact with respective metal preforms 830 and 840. Metal preforms 830 and 840 are not cold bonded to substrates 802 and 804, respectively. This may advantageously allow substrates 802 and 804 to move independently of heat sinks 834 and 844. There may be a gap between a substrate and a corresponding heatsink to maximize coefficient of thermal expansion (CTE) compliance. The gap may, however, create some thermal inefficiencies. Alternatively, there may not be any gap between the substrate and the corresponding heatsink to maximize thermal efficiency at the expense of CTE compliance. Although FIG. 8 shows a certain number of components bonded using indium bumps to a substrate, other attachment techniques may also be used. In addition, although FIG. 8 shows a certain number of components arranged in a certain manner, they could be arranged differently.

Figure 9:
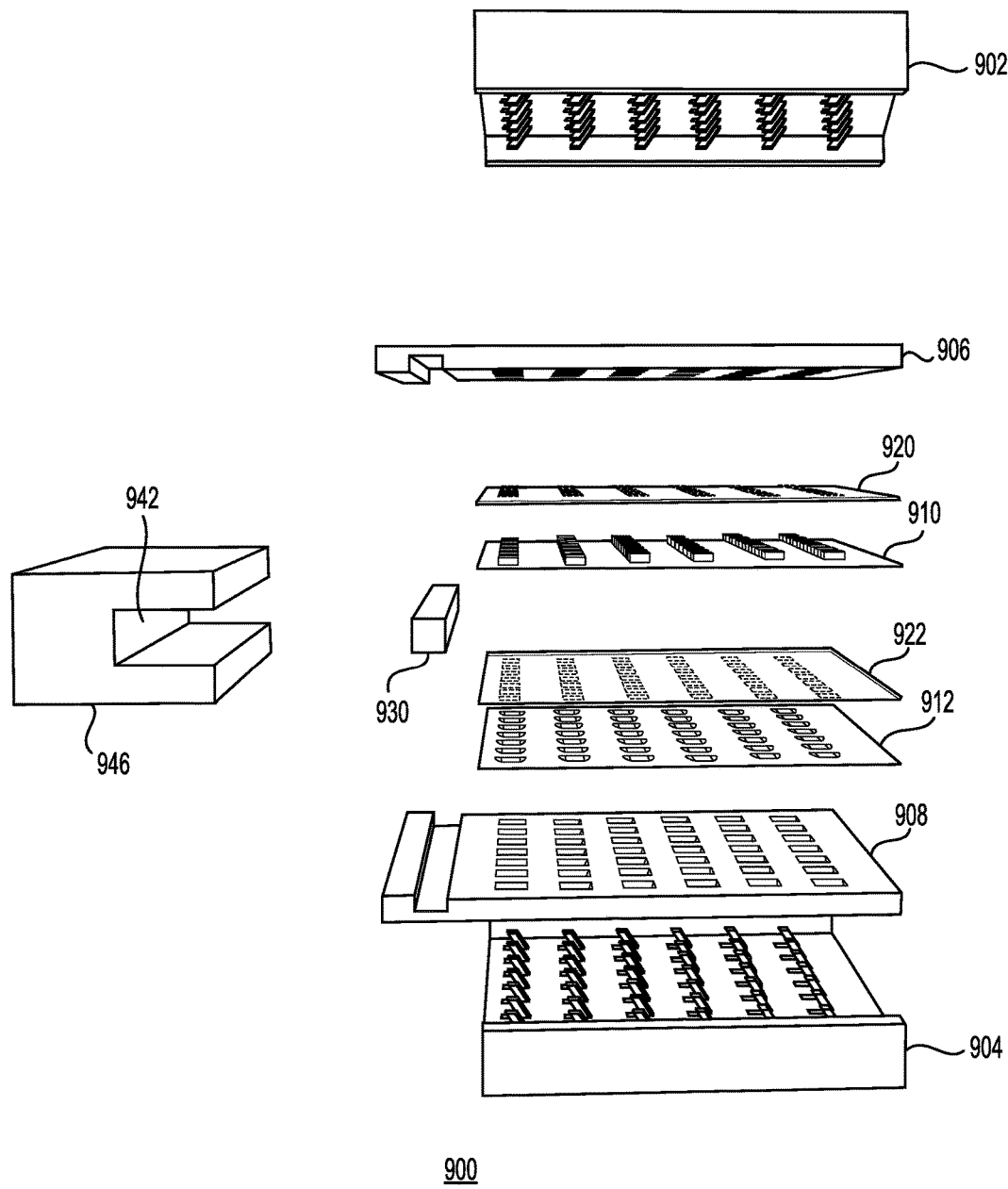
FIG. 9 shows a diagram showing steps corresponding to a method for making a two-sided assembly that may be used as part of a computing system.

FIG. 9 shows a method for making a two-sided assembly (e.g., two-sided assembly 700 of FIG. 7). As part of this method, first heat sinks 906 and 908 may be formed with recesses formed in each of them to provide a space to accommodate at least a portion of the superconducting components attached to the respective substrates. Next, metal preforms 912 and 920 may be bonded to at least portion of the respective heat sinks 908 and 906. As explained earlier, this step may include applying sufficient pressure to the metal preform to create cold-bonding between the metal (e.g., indium) of the metal preform with the metal (e.g., copper) of the heat sink. The cold-bonds may be created in certain portions of the heat sink and the metal preform. As an example, no cold-bonds may be created in the recessed portions of the heat sinks.

With continued reference to FIG. 9, next the substrates (e.g., substrate 910 and substrate 922) may be pressed against the metal preforms. As explained earlier with respect to FIG. 4, this may result in the deformation of the respective metal preforms. The top surfaces of the superconducting components may be coated with indium or another suitable metal. This may result in cold-bonding between the respective metal preforms and the top surface of the superconducting components. This may result in better thermal conduction from the superconducting components to the metal preforms and then to the heat sinks.

Next, spring boards 902 and 904 may be attached to respective heat sinks. As explained earlier the spring loaded force may create a gentle clamping force on top of the portions of the metal preform that are in direct contact with the respective metal preform portions. The next step may include clamping each of the heat sinks to a cold rail 946 to transfer thermal energy from each of the superconducting components to cold rail 946. A wedge-lock 930 may be used as part of this step. A recessed portion 942 of cold rail 946 may receive the heat sinks and wedge-lock 930.

In conclusion, in one aspect of the present disclosure a computing system including a first substrate having a first surface with a first plurality of superconducting components attached to the first surface and a second substrate having a second surface with a second plurality of superconducting components attached to the second surface, is provided. The computing system may further include a first heat sink having a first surface and a first plurality of recesses formed in the first surface such that each of the first plurality of recesses is configured to provide a space to accommodate at least a portion of a first superconducting component from among the first plurality of superconducting components. The computing system may further include a second heat sink having a second surface and a second plurality of recesses formed in the second surface such that each of the second plurality of recesses is configured to provide a space to accommodate at least a portion of a second superconducting component from among the second plurality of superconducting components.

The computing system may further include a first metal preform bonded to at least a first portion of the first heat sink, where the first metal preform is configured to conform to the at least the portion of the first superconducting component when the first superconducting component is pressed against the first metal preform and hold shape even after a first pressure on the first metal preform is relieved. The computing system may further include a second metal preform bonded to at least a second portion of the second heat sink, where the second metal preform is configured to conform to the at least the portion of the first superconducting component when the second superconducting component is pressed against the second metal preform and hold shape even after a second pressure on the second metal preform is relieved.

The computing system may further include (1) a first spring board configured to apply a first clamping force on at least a first portion of the first metal preform in direct contact with a first surface of the first superconducting component, and (2) a second spring board configured to apply a second clamping force on at least a second portion of the second metal preform in direct contact with a second surface of the second superconducting component. Each of the at least the first surface of the first superconducting component and the at least the second surface of the second superconducting component may be coated with indium.

The metal preform may comprise indium or copper. The first metal preform may be cold-bonded to the at least the first portion of the first heat sink, and the second metal preform may be cold-bonded to the at least the second portion of the second heat sink. The at least the first surface of the first superconducting component may be cold-bonded with at least the first portion of the first metal preform in direct contact with the first surface of the first superconducting component, and the at least the second surface of the second superconducting component may be cold-bonded with at least the second portion of the second metal preform in direct contact with the second surface of the second superconducting component.

The computing system may be located inside a housing configured to maintain a vacuum inside the housing, and where the vacuum corresponds to a pressure in a range between $10^{-3}$ Torr to $10^{-10}$ Torr. Each of the first heat sink and the second heat sink may be coupled to a cold rail to transfer thermal energy from each of the first plurality of superconducting components and the second plurality of superconducting components to the cold rail.

In another aspect the present disclosure relates to a computing system including a first substrate having a first surface with a first plurality of superconducting components attached to the first surface and a second substrate having a second surface with a second plurality of superconducting components attached to the second surface. The computing system may further include a first heat sink having a first surface and a first plurality of recesses formed in the first surface such that each of the first plurality of recesses is configured to provide a space to accommodate at least a portion of a first superconducting component from among the first plurality of superconducting components. The computing system may further include a second heat sink having a second surface and a second plurality of recesses formed in the second surface such that each of the second plurality of recesses is configured to provide a space to accommodate at least a portion of a second superconducting component from among the second plurality of superconducting components.

The computing system may further include a first indium preform cold-bonded to at least a first portion of the first heat sink, where the first indium preform is configured to conform to the at least the portion of the first superconducting component when the first superconducting component is pressed against the first indium preform and hold shape even after a first pressure on the first indium preform is relieved. The computing system may further include a second indium preform cold-bonded to at least a second portion of the second heat sink, where the second indium preform is configured to conform to the at least the portion of the first superconducting component when the second superconducting component is pressed against the second indium preform and hold shape even after a second pressure on the second indium preform is relieved.

The computing system may further include: (1) a first spring board configured to apply a first clamping force on at least a first portion of the first indium preform in direct contact with a first surface of the first superconducting component, and (2) a second spring board configured to apply a second clamping force on at least a second portion of the second indium preform in direct contact with a second surface of the second superconducting component. Each of the at least the first surface of the first superconducting component and the at least the second surface of the second superconducting component may be coated with indium.

The computing system may be located inside a housing configured to maintain a vacuum inside the housing, and where the vacuum corresponds to a pressure in a range between $10^{-3}$ Torr to $10^{-10}$ Torr. Each of the first heat sink and the second heat sink may be coupled to a cold rail to transfer thermal energy from each of the first plurality of superconducting components and the second plurality of superconducting components to the cold rail. The cold rail may be clamped to each of the first heat sink and the second heat sink.

In the computing system, at least the first surface of the first superconducting component may be cold-bonded with at least the first portion of the first indium preform in direct contact with the first surface of the first superconducting component, and the at least the second surface of the second superconducting component may be cold-bonded with at least the second portion of the second indium preform in direct contact with the second surface of the second superconducting component.

In yet another aspect, the present disclosure relates to a method for manufacturing a computing system comprising a first substrate having a first surface with first plurality of superconducting components attached to the first surface, a second substrate having a second surface with a second plurality of superconducting components attached to the second surface. The method may include forming a first heat sink having a first surface and a first plurality of recesses formed in the first surface such that each of the first plurality of recesses is configured to provide a space to accommodate at least a portion of a first superconducting component from among the first plurality of superconducting components. The method may further include forming a second heat sink having a second surface and a second plurality of recesses formed in the second surface such that each of the second plurality of recesses is configured to provide a space to accommodate at least a portion of a second superconducting component from among the second plurality of superconducting components.

The method may further include bonding a first metal preform bonded to at least a first portion of the first heat sink, where the first metal preform is configured to conform to the at least the portion of the first superconducting component when the first superconducting component is pressed against the first metal preform and hold shape even after a first pressure on the first metal preform is relieved. The method may further include bonding a second metal preform bonded to at least a second portion of the second heat sink, where the second metal preform is configured to conform to the at least the portion of the first superconducting component when the second superconducting component is pressed against the second metal preform and hold shape even after a second pressure on the second metal preform is relieved. The metal preform may comprise indium or copper.

The method may further include coating at least one surface of each of the first plurality of superconducting components and at least one surface of the second plurality of superconducting components with indium. The method may further include clamping each of the first heat sink and the second heat sink to a cold rail to transfer thermal energy from each of the first plurality of superconducting components and the second plurality of superconducting components to the cold rail. The method may further include (1) using a first spring board applying a first clamping force on at least a first portion of the first metal preform in direct contact with a first surface of the first superconducting component, and (2) using a second spring board applying a second clamping force on at least a second portion of the second metal preform in direct contact with a second surface of the second superconducting component.

It is to be understood that the methods, modules, and components depicted herein are merely exemplary. For example, and without limitation, illustrative types of superconducting devices may include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:
1. A computing system comprising:
a first substrate having a first surface with first plurality of superconducting components attached to the first surface;
a second substrate having a second surface with a second plurality of superconducting components attached to the second surface;
a first heat sink having a first surface and a first plurality of recesses formed in the first surface such that each of the first plurality of recesses is configured to provide a space to accommodate at least a portion of a first superconducting component from among the first plurality of superconducting components;
a second heat sink having a second surface and a second plurality of recesses formed in the second surface such that each of the second plurality of recesses is configured to provide a space to accommodate at least a portion of a second superconducting component from among the second plurality of superconducting components;
a first metal preform bonded to at least a first portion of the first heat sink, wherein the first metal preform is configured to conform to the at least the portion of the first superconducting component when the first superconducting component is pressed against the first metal preform and hold shape even after a first pressure on the first metal preform is relieved; and
a second metal preform bonded to at least a second portion of the second heat sink, wherein the second metal preform is configured to conform to the at least the portion of the first superconducting component when the second superconducting component is pressed against the second metal preform and hold shape even after a second pressure on the second metal preform is relieved.

2. The computing system of claim 1 further comprising: (1) a first spring board configured to apply a first clamping force on at least a first portion of the first metal preform in direct contact with a first surface of the first superconducting component, and (2) a second spring board configured to apply a second clamping force on at least a second portion of the second metal preform in direct contact with a second surface of the second superconducting component.

3. The computing system of claim 2, wherein each of the at least the first surface of the first superconducting component and the at least the second surface of the second superconducting component is coated with indium.

4. The computing system of claim 1, wherein the metal preform comprises indium or copper.

5. The computing system of claim 1, wherein the first metal preform is cold-bonded to the at least the first portion of the first heat sink, and wherein the second metal preform is cold-bonded to the at least the second portion of the second heat sink.

6. The computing system of claim 1, wherein the computing system is located inside a housing configured to maintain a vacuum inside the housing, and wherein the vacuum corresponds to a pressure in a range between $10^{-3}$ Torr to $10^{-10}$ Torr.

7. The computing system of claim 1, wherein each of the first heat sink and the second heat sink is coupled to a cold rail to transfer thermal energy from each of the first plurality of superconducting components and the second plurality of superconducting components to the cold rail.

8. The computing system of claim 3, wherein the at least the first surface of the first superconducting component is cold-bonded with at least the first portion of the first metal preform in direct contact with the first surface of the first superconducting component, and wherein the at least the second surface of the second superconducting component is cold-bonded with at least the second portion of the second metal preform in direct contact with the second surface of the second superconducting component.

9. A computing system comprising:
a first substrate having a first surface with first plurality of superconducting components attached to the first surface;
a second substrate having a second surface with a second plurality of superconducting components attached to the second surface;
a first heat sink having a first surface and a first plurality of recesses formed in the first surface such that each of the first plurality of recesses is configured to provide a space to accommodate at least a portion of a first superconducting component from among the first plurality of superconducting components;
a second heat sink having a second surface and a second plurality of recesses formed in the second surface such that each of the second plurality of recesses is configured to provide a space to accommodate at least a portion of a second superconducting component from among the second plurality of superconducting components;
a first indium preform cold-bonded to at least a first portion of the first heat sink, wherein the first indium preform is configured to conform to the at least the portion of the first superconducting component when the first superconducting component is pressed against the first indium preform and hold shape even after a first pressure on the first indium preform is relieved; and
a second indium preform cold-bonded to at least a second portion of the second heat sink, wherein the second indium preform is configured to conform to the at least the portion of the first superconducting component when the second superconducting component is pressed against the second indium preform and hold shape even after a second pressure on the second indium preform is relieved.

10. The computing system of claim 9 further comprising: (1) a first spring board configured to apply a first clamping force on at least a first portion of the first indium preform in direct contact with a first surface of the first superconducting component, and (2) a second spring board configured to apply a second clamping force on at least a second portion of the second indium preform in direct contact with a second surface of the second superconducting component.

11. The computing system of claim 10, wherein each of the at least the first surface of the first superconducting component and the at least the second surface of the second superconducting component is coated with indium.

12. The computing system of claim 9, wherein the computing system is located inside a housing configured to maintain a vacuum inside the housing, and wherein the vacuum corresponds to a pressure in a range between $10^{-3}$ Torr to $10^{-10}$ Torr.

13. The computing system of claim 9, wherein each of the first heat sink and the second heat sink is coupled to a cold rail to transfer thermal energy from each of the first plurality of superconducting components and the second plurality of superconducting components to the cold rail.

14. The computing system of claim 13, wherein the cold rail is clamped to each of the first heat sink and the second heat sink.

15. The computing system of claim 10, wherein the at least the first surface of the first superconducting component is cold-bonded with at least the first portion of the first indium preform in direct contact with the first surface of the first superconducting component, and wherein the at least the second surface of the second superconducting component is cold-bonded with at least the second portion of the second indium preform in direct contact with the second surface of the second superconducting component.

16. A method for manufacturing a computing system comprising a first substrate having a first surface with first plurality of superconducting components attached to the first surface, a second substrate having a second surface with a second plurality of superconducting components attached to the second surface, the method comprising:
forming a first heat sink having a first surface and a first plurality of recesses formed in the first surface such that each of the first plurality of recesses is configured to provide a space to accommodate at least a portion of a first superconducting component from among the first plurality of superconducting components;
forming a second heat sink having a second surface and a second plurality of recesses formed in the second surface such that each of the second plurality of recesses is configured to provide a space to accommodate at least a portion of a second superconducting component from among the second plurality of superconducting components;
bonding a first metal preform bonded to at least a first portion of the first heat sink, wherein the first metal preform is configured to conform to the at least the portion of the first superconducting component when the first superconducting component is pressed against the first metal preform and hold shape even after a first pressure on the first metal preform is relieved; and bonding a second metal preform bonded to at least a second portion of the second heat sink, wherein the second metal preform is configured to conform to the at least the portion of the first superconducting component when the second superconducting component is pressed against the second metal preform and hold shape even after a second pressure on the second metal preform is relieved.

17. The method of claim 16, wherein the metal preform comprises indium or copper.

18. The method of claim 16 further comprising coating at least one surface of each of the first plurality of superconducting components and at least one surface of the second plurality of superconducting components with indium.

19. The method of claim 16 further comprising clamping each of the first heat sink and the second heat sink to a cold rail to transfer thermal energy from each of the first plurality of superconducting components and the second plurality of superconducting components to the cold rail.

20. The method of claim 18 further comprising: (1) using a first spring board applying a first clamping force on at least a first portion of the first metal preform in direct contact with a first surface of the first superconducting component, and (2) using a second spring board applying a second clamping force on at least a second portion of the second metal preform in direct contact with a second surface of the second superconducting component.

* * * * *